(12) United States Patent
Chung

(10) Patent No.: US 10,784,237 B1
(45) Date of Patent: Sep. 22, 2020

(54) METHOD FOR FABRICATING AN EMISSIVE DISPLAY

(71) Applicants: INTERFACE TECHNOLOGY (CHENGDU) CO., LTD., Chengdu (CN); INTERFACE OPTOELECTRONICS (SHENZHEN) CO., LTD., Shenzhen (CN); GENERAL INTERFACE SOLUTION LIMITED, Miaoli County (TW)

(72) Inventor: Chin-Feng Chung, Shenzhen (CN)

(73) Assignees: INTERFACE TECHNOLOGY (CHENGDU) CO., LTD., Chengdu, Sichuan (CN); INTERFACE OPTOELECTRONICS (SHENZHEN) CO., LTD., Shenzhen, Guangdong (CN); GENERAL INTERFACE SOLUTION LIMITED, Miaoli County (TW)

(*) Notice: Subject to any disclaimer, the term of this patent is extended or adjusted under 35 U.S.C. 154(b) by 0 days.

(21) Appl. No.: 16/410,041

(22) Filed: May 13, 2019

(30) Foreign Application Priority Data

Apr. 19, 2019 (CN) .......................... 2019 1 0317135

(51) Int. Cl.
*H01L 25/075* (2006.01)
*H01L 33/62* (2010.01)
*H01L 27/15* (2006.01)

(52) U.S. Cl.
CPC .......... *H01L 25/0753* (2013.01); *H01L 33/62* (2013.01); *H01L 27/156* (2013.01)

(58) Field of Classification Search
CPC .......................... H01L 25/0753; H01L 27/156
See application file for complete search history.

(56) References Cited

U.S. PATENT DOCUMENTS

2019/0058081 A1* 2/2019 Ahmed ................... H01L 33/62

* cited by examiner

*Primary Examiner* — Daniel P Shook
(74) *Attorney, Agent, or Firm* — Rosenberg, Klein & Lee

(57) ABSTRACT

In a method for fabricating an emissive display, a package substrate with a top thereof having a plurality of wells is firstly provided. The well has a first electrode region and a second electrode region at different heights. The package substrate sinks in a suspension. Then, a plurality of light-emitting diodes sinks in the suspension. The light-emitting diode has a plane and a curved surface. Finally, the suspension horizontally jets such that the suspension flows across the plane and the curved surface of the light-emitting diode at different velocities. According to the different velocities, the suspension respectively embeds all the light-emitting diodes into all the wells. Each of the plurality of light-emitting diodes are respectively electrically connected to the first electrode region and the second electrode region of a corresponding one of the plurality of wells, thereby forming an emissive display.

10 Claims, 5 Drawing Sheets

US 10,784,237 B1

METHOD FOR FABRICATING AN EMISSIVE DISPLAY

This application claims priority for China patent application no. 201910317135.3 filed on Apr. 19, 2019, the content of which is incorporated by reference in its entirely.

BACKGROUND OF THE INVENTION

Field of the Invention

The present invention relates to a method for fabricating an electronic device, particularly to a method for fabricating an emissive display.

Description of the Related Art

The fluidic transfer of microfabricated electronic devices, optoelectronic devices, and sub-systems from a donor substrate/wafer to a large area and/or unconventional substrate provides a new opportunity to extend the application range of electronic and optoelectronic devices. For example, display pixel size light emitting diode (LED) micro structures, such as rods, fins, or disks, can be first fabricated on small size wafers and then be transferred to large panel glass substrate to make a direct emitting display. One conventional means of transferring these LED microstructures is through a pick-and-place process. However, with a display comprising millions of elements, such a process may take several hours to complete and is therefore inefficient.

To overcome the abovementioned problems, the present invention provides a method for fabricating an emissive display, so as to solve the afore-mentioned problems of the prior art.

SUMMARY OF THE INVENTION

The primary objective of the present invention is to provide a method for fabricating an emissive display, which assembles a package substrate and LEDs according to the Bernoulli's principle without causing damage to the package substrate and the LEDs, thereby completing mass transfer.

The secondary objective of the present invention is to provide a method for fabricating an emissive display, which uses the package substrate to design two electrode regions arranged at different heights and separated from each other lest the LEDs short-circuit.

To achieve the abovementioned objectives, the present invention provides a method for fabricating an emissive display, which comprises: providing a package substrate with a top thereof having a plurality of wells, a bottom of each of the plurality of wells has a first electrode region, a sidewall of each of the plurality of wells has a second electrode region, the first electrode region and the second electrode region are arranged at different heights and separated from each other, a density of the package substrate is larger than a density of a suspension, and the package substrate sinks in the suspension; providing a plurality of light-emitting diodes, a density of each of the plurality of light-emitting diodes is 90~99.99% of the density of the suspension, a top surface and a bottom surface of each of the plurality of light-emitting diodes are respectively a plane and a curved surface, the curved surface of each of the plurality of light-emitting diodes has a third electrode region whose position corresponds to a position of the first electrode region, a sidewall of each of the plurality of light-emitting diodes has a fourth electrode region whose position corresponds to a position of the second electrode region, and the plurality of light-emitting diodes sinks in the suspension; and horizontally jetting the suspension and flowing the suspension across the plane and the curved surface of each of the plurality of light-emitting diodes at different velocities, the suspension respectively embeds the plurality of light-emitting diodes into the plurality of wells according to the different velocities, and the third electrode region and the fourth electrode region of each of the plurality of light-emitting diodes are respectively electrically connected to the first electrode region and the second electrode region of a corresponding one of the plurality of wells, thereby forming an emissive display.

In an embodiment of the present invention, the process of fabricating the package substrate further comprises: sequentially forming a first patterned electrode layer and a first photocuring polymer layer on a transparent substrate, and the transparent substrate and the first patterned electrode layer are covered with the first photocuring polymer layer; providing a first mother mold with a bottom thereof having a first imprinting pattern, using the first imprinting pattern of the first mother mold to imprint the first photocuring polymer layer such that the first mother mold touches the first patterned electrode layer, and using the first photocuring polymer layer to form a plurality of second imprinting patterns corresponding to the first imprinting pattern; using a first light to illuminate the first photocuring polymer layer to cure the first photocuring polymer layer; removing the first mother mold to expose the first patterned electrode layer and the plurality of second imprinting patterns; forming a second patterned electrode layer on the plurality of second imprinting patterns and arranging the second patterned electrode layer along an edge of each of the plurality of second imprinting patterns; forming a second photocuring polymer layer on the first patterned electrode layer, the second patterned electrode layer, and the plurality of second imprinting patterns to cover the first patterned electrode layer, the second patterned electrode layer, and the plurality of second imprinting patterns; providing a second mother mold with a bottom thereof having a third imprinting pattern, using the third imprinting pattern of the second mother mold to imprint the second photocuring polymer layer and the second patterned electrode layer such that the second mother mold touches the first patterned electrode layer and the second patterned electrode layer, using the second photocuring polymer layer to form a plurality of fourth imprinting patterns corresponding to the third imprinting pattern, and using the plurality of second imprinting patterns and the plurality of fourth imprinting patterns to separate the first patterned electrode layer from the second patterned electrode layer; using a second light to illuminate the second photocuring polymer layer to cure the second photocuring polymer layer; and removing the second mother mold to expose the plurality of fourth imprinting patterns, the first patterned electrode layer, and the second patterned electrode layer, using the plurality of fourth imprinting patterns, the first patterned electrode layer, and the second patterned electrode layer to form the plurality of wells, using the first pattered electrode layer as the first electrode region of each of the plurality of wells, and using the second pattered electrode layer as the second electrode region of each of the plurality of wells.

In an embodiment of the present invention, the first light and the second light are ultraviolet light.

In an embodiment of the present invention, the second pattered electrode layer consists of a plurality of ring-shaped electrodes, the plurality of ring-shaped electrodes are arranged on the plurality of second imprinting patterns, and each of the plurality of ring-shaped electrodes is arranged along an edge of a corresponding one of the plurality of second imprinting patterns.

In an embodiment of the present invention, the side wall of each of the plurality of fourth imprinting patterns and a corresponding one of the plurality of ring-shaped electrodes are form a conical surface.

In an embodiment of the present invention, the fourth electrode region is a ring-shaped electrode region.

In an embodiment of the present invention, the curved surface is a spherical surface.

In an embodiment of the present invention, the third electrode region is arranged at a center of the spherical surface.

In an embodiment of the present invention, the ratio of a weight of the plurality of light-emitting diodes to a weight of the suspension is larger than 0 and the ratio is less than or equal to 20%.

In an embodiment of the present invention, the sidewall and the bottom surface of each of the plurality of light-emitting diodes respectively have shapes of a sidewall and a bottom surface of a bowl.

Below, the embodiments are described in detail in cooperation with the drawings to make easily understood the technical contents, characteristics and accomplishments of the present invention.

DETAILED DESCRIPTION OF THE INVENTION

Figure 1:
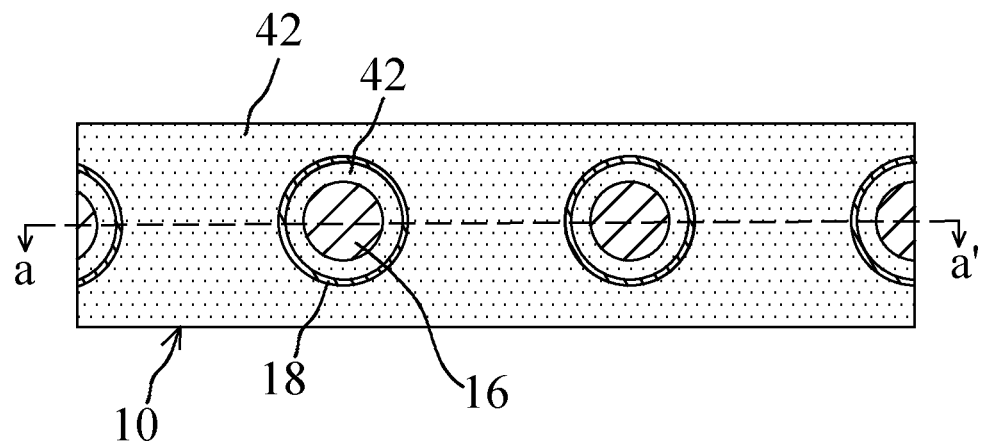
FIG. 1 is a top view of a package substrate according to an embodiment of the present invention.
Figure 2:
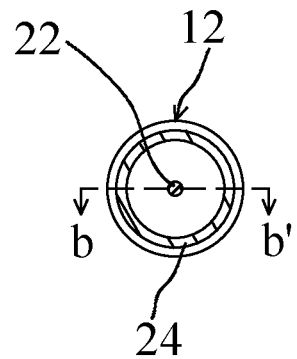
FIG. 2 is a bottom view of a light-emitting diode according to an embodiment of the present invention.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Throughout the description and claims, it will be understood that when a component is referred to as being "positioned on," "positioned above," "connected to," "engaged with," or "coupled with" another component, it can be directly on, directly connected to, or directly engaged with the other component, or intervening component may be present. In contrast, when a component is referred to as being "directly on," "directly connected to," or "directly engaged with" another component, there are no intervening components present. The term "and/or" may comprise any and all combinations of one or more of the associated listed items. In addition, the singular forms "a," "an," and "the" herein are intended to comprise the plural forms as well, unless the context clearly indicates otherwise.

Figure 3A:
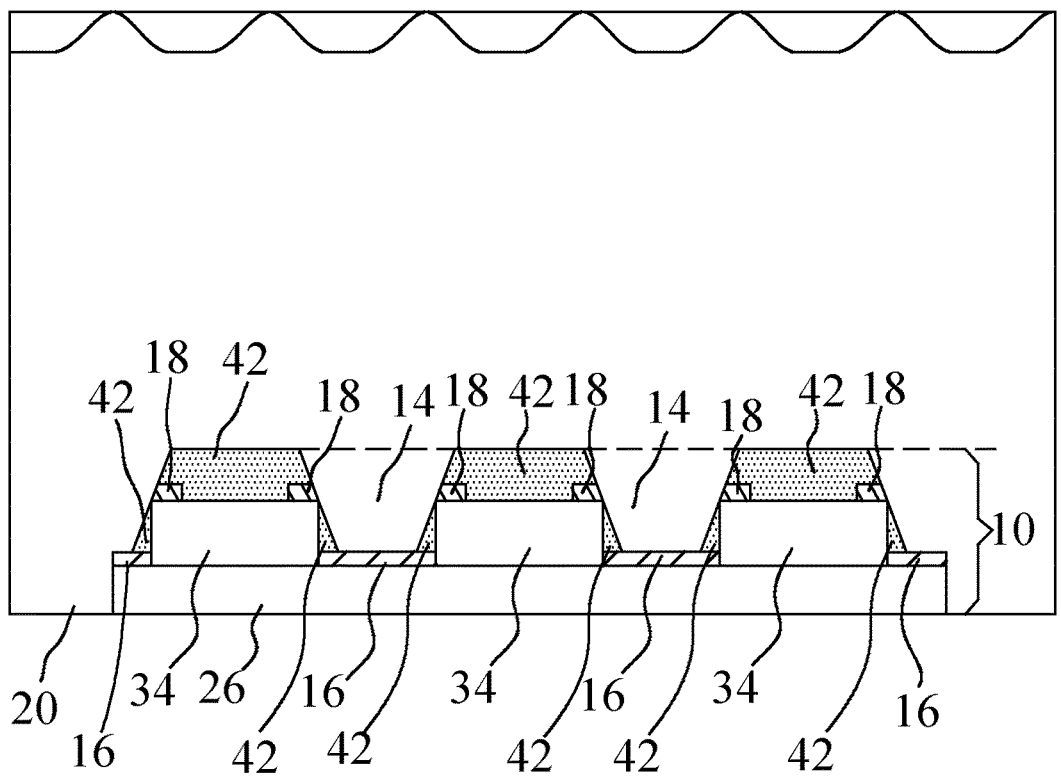
FIGS. 3(a)-3(d) are diagrams schematically showing the steps of a method for fabricating an emissive display according to an embodiment of the present invention.
Figure 3B:
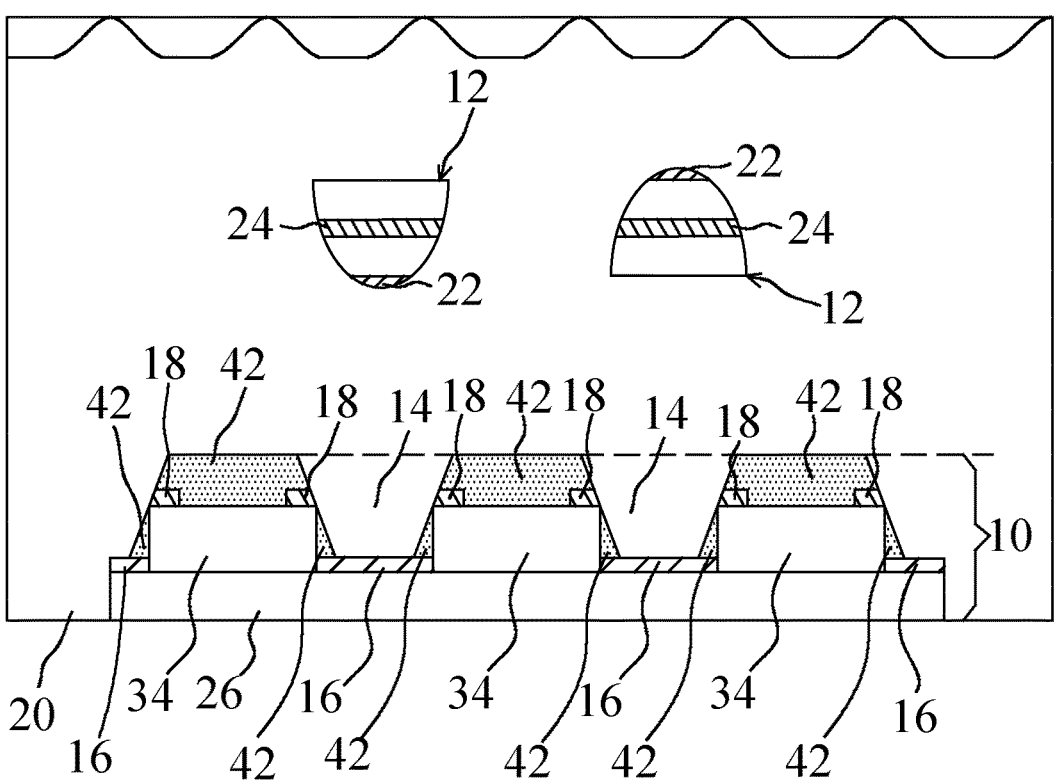
Figure 3C:
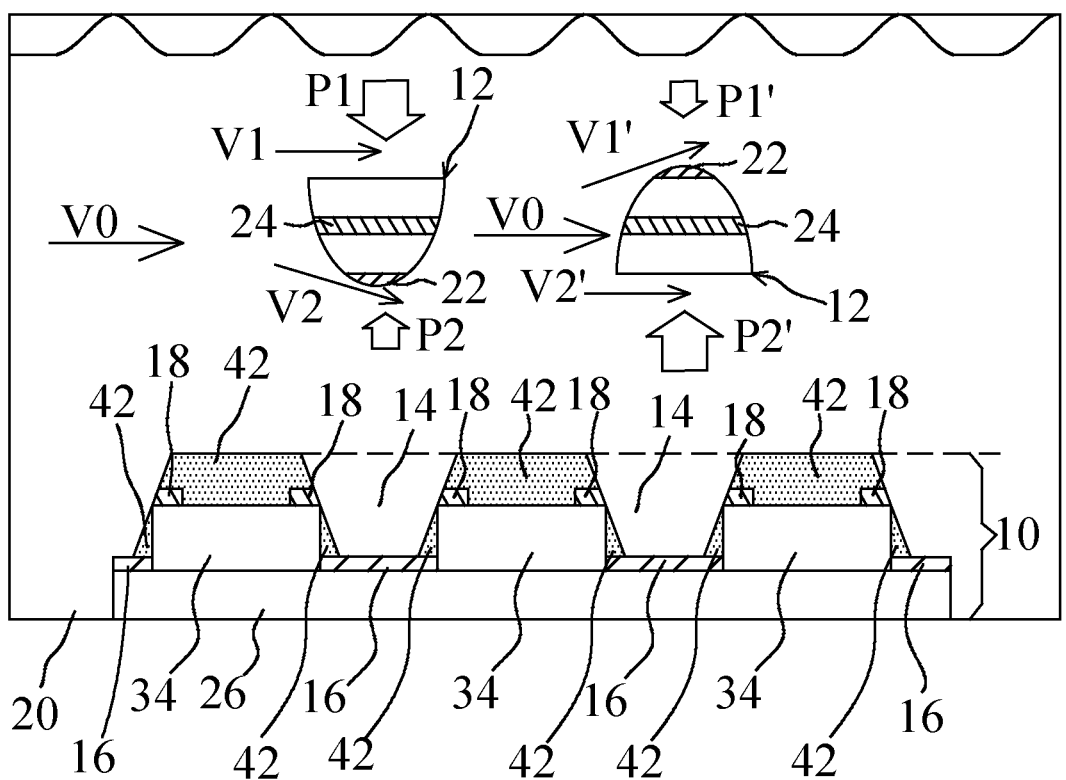
Figure 3D:
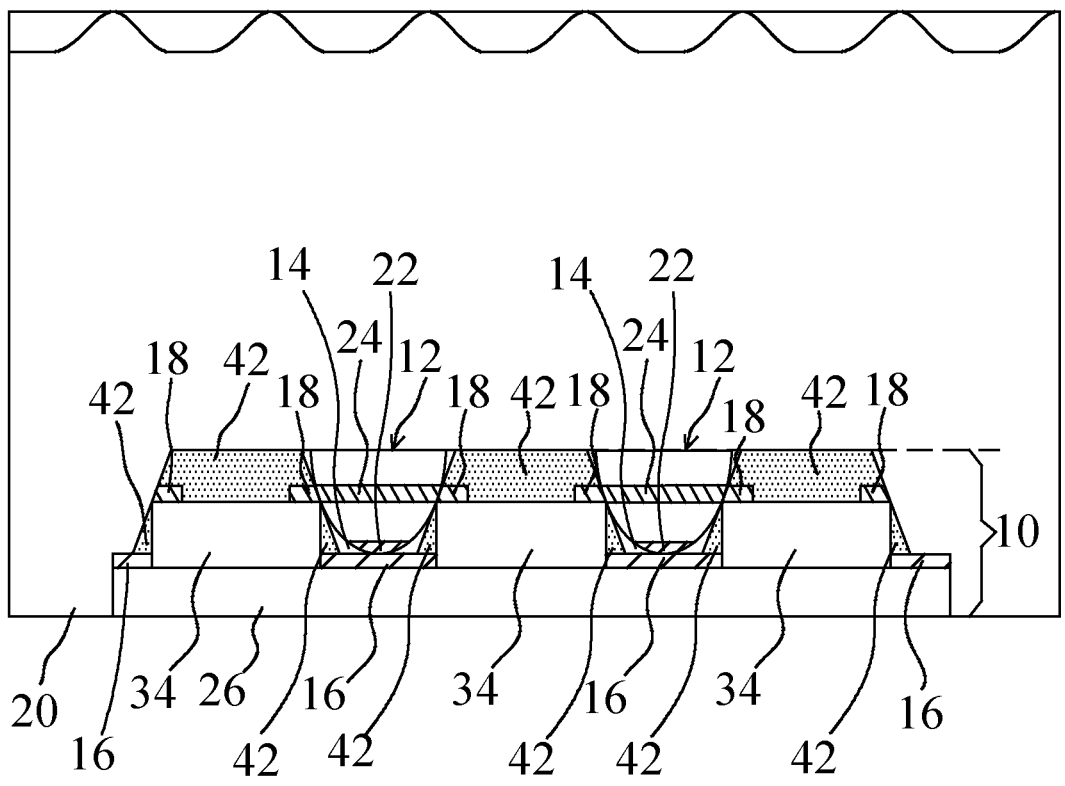

Refer to FIG. 1, FIG. 2, and FIGS. 3(a)-3(d). The method for fabricating an emissive display is introduced as follows. The emissive display comprises a package substrate 10 and a plurality of light-emitting diodes 12. The package substrate 10 illustrated in FIGS. 3(a)-3(d) is a sectional view taken along Line a-a' of FIG. 1. The light-emitting diodes 12 illustrated in FIGS. 3(a)-3(d) is a sectional view taken along Line b-b' of FIG. 2. As shown in FIG. 3(a), a package substrate 10 is firstly provided. The top of the package substrate 10 has a plurality of wells 14. The bottom of each of the plurality of wells 14 has a first electrode region 16. The sidewall of each of the plurality of wells 14 has a second electrode region 18. The first electrode region 16 and the second electrode region 18 are arranged at different heights and separated from each other. The density of the package substrate 10 is larger than the density of a liquid suspension 20. The package substrate 10 sinks in the suspension 20. In some embodiments of the present invention, the second electrode region 18 is a ring-shaped electrode region. Then, as shown in FIG. 3(b), a plurality of light-emitting diodes 12 is provided. The density of each of the plurality of light-emitting diodes 12 is 90~99.99% of the density of the suspension 20. The top surface and the bottom surface of each of the plurality of light-emitting diodes 12 are respectively a plane and a curved surface. In some embodiments of the present invention, the curved surface is a spherical surface. The curved surface of each of the plurality of light-emitting diodes 12 has a third electrode region 22 whose position corresponds to the position of the first electrode region 16. The sidewall of each of the plurality of light-emitting diodes 12 has a fourth electrode region 24 whose position corresponds to the position of the second electrode region 18. The plurality of light-emitting diodes 12 sinks in the suspension 20. In some embodiments of the present invention, the fourth electrode region 24 is a ring-shaped electrode region. The third electrode region 22 is arranged at the center of the spherical surface used as the bottom surface of the light-emitting diode 12. The ratio of the weight of all the light-emitting diodes 12 to the weight of the suspension 20 is larger than 0 and the ratio is less than or equal to 20%. The sidewall and the bottom surface of each of the plurality of light-emitting diodes 12 respectively have shapes of the sidewall and the bottom surface of a bowl. In other words, the front side and the back side of each of the plurality of light-emitting diodes 12 are symmetric to each other and the right side and the left side of each of the plurality of light-emitting diodes 12 are symmetric to each other. If the ratio of the weight of all the light-emitting diodes 12 to the weight of the suspension 20 is larger than 20%, turbulence will be formed, which is unfavorable to moving the plurality of light-emitting diodes 12. Finally, as shown in FIG. 3(c) and FIG. 3(d), the suspension 20 horizontally jets and flows across the plane and the curved surface of each of the plurality of light-emitting diodes 12 at different velocities. The suspension 20 respectively embeds the plurality of light-emitting diodes 12 into the plurality of wells 14 according to the different velocities. The third electrode region 22 and the fourth electrode region 24 of each of the plurality of light-emitting diodes 12 are respectively electrically connected to the first electrode region 16 and the second electrode region 18 of a corresponding one of the plurality of wells 14, thereby forming an emissive display.

The present invention assembles the package substrate 10 and light-emitting diodes 12 according to the Bernoulli's principle without causing damage to the package substrate 10 and the light-emitting diodes 12, thereby completing mass transfer. As shown in FIG. 3(c), each of the light-emitting diodes 12 has a velocity V0 when the suspension 20 horizontally jets. Taking the left light-emitting diode 12 as an example. According to the Bernoulli's principle, the suspension 20 flows across the plane and the curved surface of each of the plurality of light-emitting diodes 12 at different velocities. Since the plane has a shorter path and the curved surface has a longer path, the velocity V1 that the suspension 20 flows across the plane is lower and the velocity V2 that the suspension 20 flows across the curved surface is higher. The velocity V1 causes a downward pressure P1 and the velocity V2 causes an upward pressure P2. Since the downward pressure P1 is larger than the upward pressure P2, the suspension 20 accelerates and embeds the left light-emitting diode 12 into the well 14. Taking the right light-emitting diode 12 as an example. According to the Bernoulli's principle, the suspension 20 flows across the plane and the curved surface of each of the plurality of light-emitting diodes 12 at different velocities. Since the plane has a shorter path and the curved surface has a longer path, the velocity V2' that the suspension 20 flows across the plane is lower and the velocity V1' that the suspension 20 flows across the curved surface is higher. The velocity V1' causes a downward pressure P1' and the velocity V2' causes an upward pressure P2'. Since the upward pressure P2' is larger than the downward pressure P1', the right light-emitting diode 12 does not sink. The right light-emitting diode 12 has to be turned over whereby the curved surface of the light-emitting diode 12 faces toward the well 14. This way, the right light-emitting diode 12 is embedded into the well 14. That is to say, the curved surfaces of all the light-emitting diodes 12 have to face toward the wells 14, such that all the light-emitting diodes 12 sink and the suspension 20 embeds all the light-emitting diodes 12 into the wells 14.

S represents the difference in area between the top surface and the bottom surface of the light-emitting diode 12, M represents the weight of the light-emitting diode 12, V represents the volume of the light-emitting diode 12, Ds represents the density of the light-emitting diode 12, $D_L$ represents the density of the suspension, g represents gravitational acceleration, C represents a lift coefficient, and v' represents a velocity of the light-emitting diode 12 relative to the suspension 20. Thus, the difference between the downward pressure P1 and the upward pressure P2 or the difference between the upward pressure P2' and downward pressure P1' causes a pushing force $F1=(\frac{1}{2})\times D_L \times v'^2 \times S \times C$. In addition, the gravity of the light-emitting diode 12 is denoted by $F2=M\times g$ and the buoyancy of the light-emitting diode 12 is denoted by $F3=V\times D_L \times g$. For the left light-emitting diode 12 in FIG. 3(c), F2+F1>F3. For the right light-emitting diode 12 in FIG. 3(c), F3+F1>F2. Since M=V×Ds, Ds and $D_L$ are obtained according to the relationship among F1, F2, and F3.

Figure 4A:
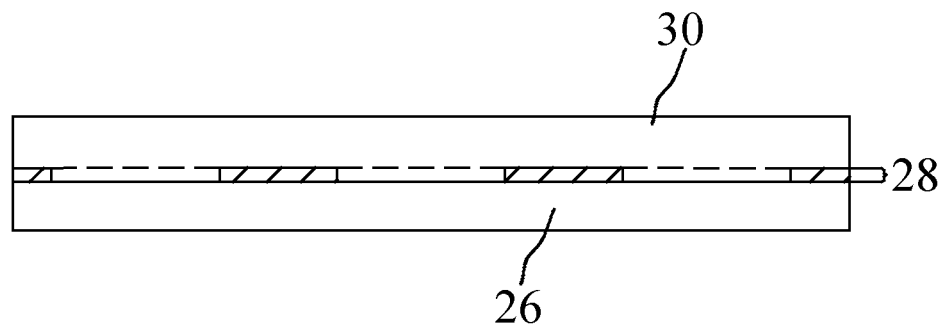
FIGS. 4(a)-4(g) are diagrams schematically showing the steps of a method for fabricating a package substrate according to an embodiment of the present invention.
Figure 4B:
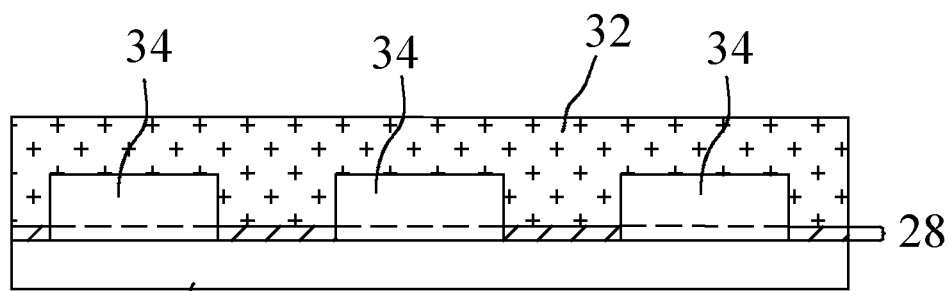
Figure 4C:
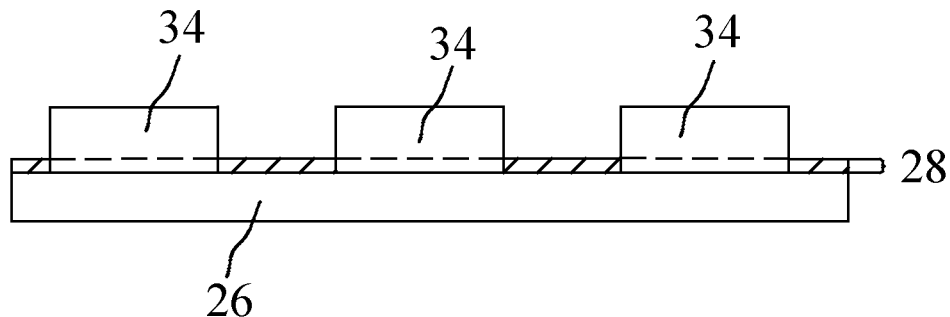
Figure 4D:
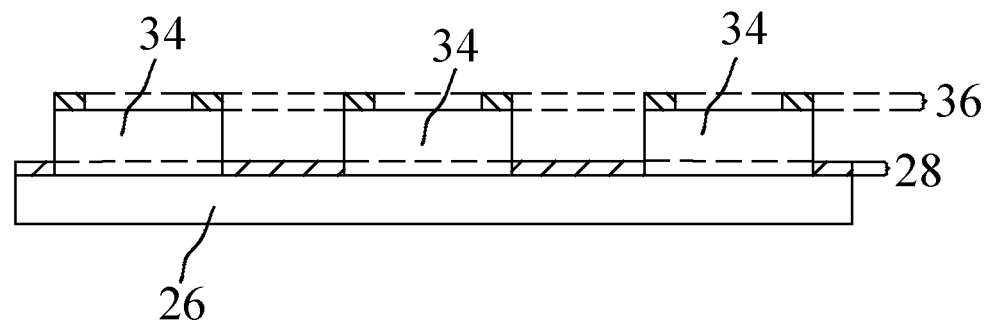
Figure 4E:
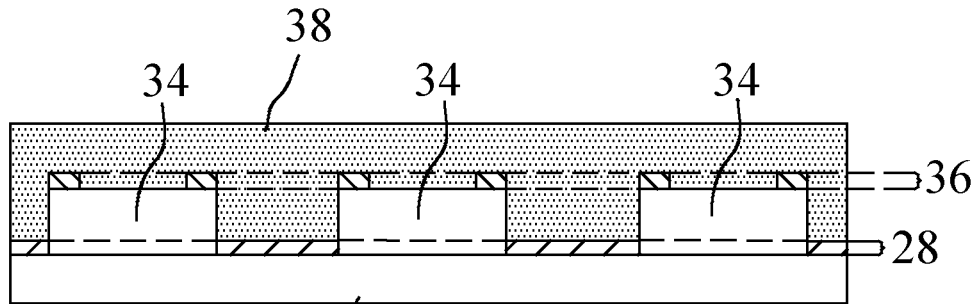
Figure 4F:
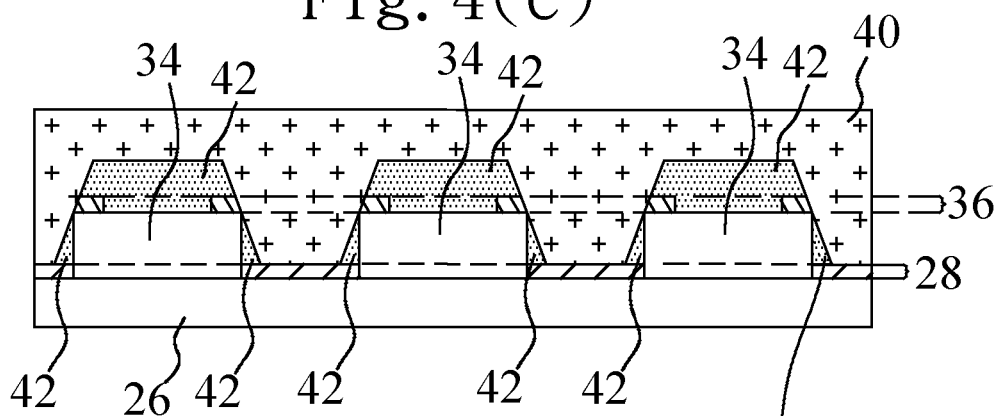
Figure 4G:
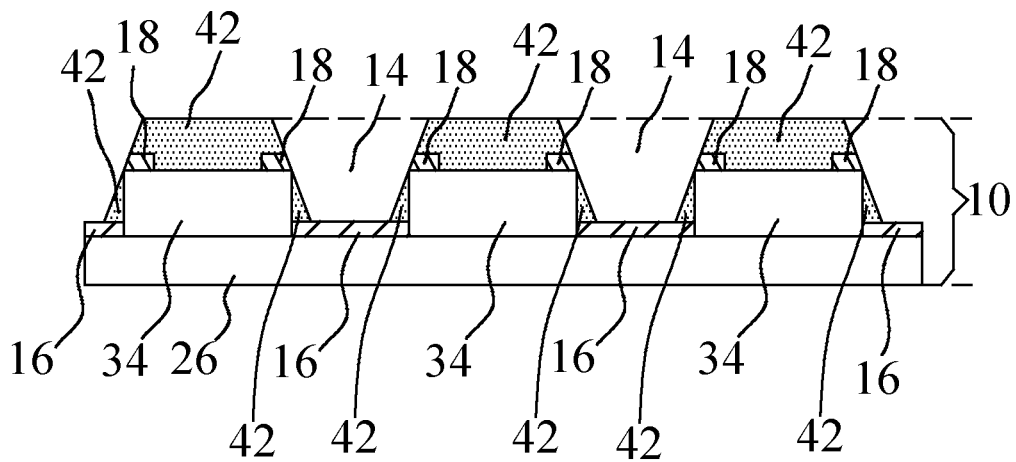

In some embodiments of the present invention, the process of fabricating the package substrate 10 further comprises the following steps. Refer to FIG. 1, FIGS. 3(a)-3(d), and FIGS. 4(a)-4(g). Firstly, as shown in FIG. 4(a), a first patterned electrode layer 28 and a first photocuring polymer layer 30 are sequentially formed on a transparent substrate 26, and the transparent substrate 26 and the first patterned electrode layer 28 are covered with the first photocuring polymer layer 30. The first patterned electrode layer 28 is formed using a printing method or a lithography method. In some embodiments of the present invention, the transparent substrate 26 may be a glass substrate and the first photocuring polymer layer 30 comprises acrylate, polyurethane, or epoxy acrylate. Then, as shown in FIG. 4(b), a first mother mold 32 with a bottom thereof having a first imprinting pattern is provided, the first imprinting pattern of the first mother mold 32 is used to imprint the first photocuring polymer layer 30 such that the first mother mold 32 touches the first patterned electrode layer 28, and the first photocuring polymer layer 30 is used to form a plurality of second imprinting patterns 34 corresponding to the first imprinting pattern. The first mother mold 32 comprises metal, bakelite, or plastic. The first mother mold 32 is processed by a milling machine to form the first imprinting pattern, such as a plurality of recesses. Then, a first light such as ultraviolet light is used to illuminate the first photocuring polymer layer 30, such that the cross-linking reaction is performed on the first photocuring polymer layer 30 to cure the first photocuring polymer layer 30. Then, as shown in FIG. 4(c), the first mother mold 32 is removed to expose the first patterned electrode layer 28 and the plurality of second imprinting patterns 34. Then, as shown in FIG. 4(d), a second patterned electrode layer 36 is formed on the plurality of second imprinting patterns 34 and the second patterned electrode layer 36 is arranged along the edge of each of the plurality of second imprinting patterns 34. The second patterned electrode layer 36 is formed using a printing method or a lithography method. In some embodiments of the present invention, the second pattered electrode layer 36 consists of a plurality of ring-shaped electrodes. All the plurality of ring-shaped electrodes are arranged on the all the plurality of second imprinting patterns 34. Each of the plurality of ring-shaped electrodes is arranged along an edge of a corresponding one of the plurality of second imprinting patterns 34. Then, as shown in FIG. 4(e), a second photocuring polymer layer 38 is formed on the first patterned electrode layer 28, the second patterned electrode layer 36, and all the plurality of second imprinting patterns 34 to cover the first patterned electrode layer 28, the second patterned electrode layer 36, and the plurality of second imprinting patterns 34. The second photocuring polymer layer 38 is formed using a spray method or a soaking method. Then, as shown in FIG. 4(f), a second mother mold 40 with a bottom thereof having a third imprinting pattern is provided. The second mother mold 40 comprises metal, bakelite, or plastic. The second mother mold 40 is processed by a milling machine to form the second imprinting pattern, such as cone-shaped patterns. The third imprinting pattern of the second mother mold 40 is used to imprint the second photocuring polymer layer 38 and the second patterned electrode layer 36 such that the second mother mold 40 touches the first patterned electrode layer 28 and the second patterned electrode layer 36. The second photocuring polymer layer 38 is used to form a plurality of fourth imprinting patterns 42 corresponding to the third imprinting pattern, and all the plurality of second imprinting patterns 34 and all the plurality of fourth imprinting patterns 42 are used to separate the first patterned electrode layer 28 from the second patterned electrode layer 36 lest the light-emitting diodes short-circuit. Specifically, the horizontal position of the second patterned electrode layer 36 is different from that of the first patterned electrode layer 28. The vertical position of the second patterned electrode layer 36 is different from that of the first patterned electrode layer 28. In some embodiments of the present invention, the side wall of each of the plurality of fourth imprinting patterns 42 and a corresponding one of the plurality of ring-shaped electrodes as the second patterned electrode layer 36 are form a conical surface. Then, a second light such as ultraviolet light is used to illuminate the second photocuring polymer layer 38, such that the cross-linking reaction is performed on the second photocuring polymer layer 38 to cure the second photocuring polymer layer 38. Finally, as shown in FIG. 4(g), the second mother mold 40 is removed to expose the plurality of fourth imprinting patterns 42, the first patterned electrode layer 28, and the second patterned electrode layer 36, the plurality of fourth imprinting patterns 42, the first patterned electrode layer 28, and the second patterned electrode layer 36 are used to form all the plurality of wells 14, the first pattered electrode layer 28 is used as the first electrode region 16 of each of the plurality of wells 14, and the second pattered electrode layer 36 is used as the second electrode region 18 of each of the plurality of wells 14.

In conclusion, the present invention assembles the package substrate and the light-emitting diodes according to the Bernoulli's principle without causing damage to the package substrate and the LEDs, thereby completing mass transfer.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A method for fabricating an emissive display comprising:
   providing a package substrate with a top thereof having a plurality of wells, a bottom of each of the plurality of wells has a first electrode region, a sidewall of each of the plurality of wells has a second electrode region, the first electrode region and the second electrode region are arranged at different heights and separated from each other, a density of the package substrate is larger than a density of a suspension, and the package substrate sinks in the suspension;
   providing a plurality of light-emitting diodes, a density of each of the plurality of light-emitting diodes is 90~99.99% of the density of the suspension, a top surface and a bottom surface of each of the plurality of light-emitting diodes are respectively a plane and a curved surface, the curved surface of each of the plurality of light-emitting diodes has a third electrode region whose position corresponds to a position of the first electrode region, a sidewall of each of the plurality of light-emitting diodes has a fourth electrode region whose position corresponds to a position of the second electrode region, and the plurality of light-emitting diodes sinks in the suspension; and
   horizontally jetting the suspension and flowing the suspension across the plane and the curved surface of each of the plurality of light-emitting diodes at different velocities, the suspension respectively embeds the plurality of light-emitting diodes into the plurality of wells according to the different velocities, and the third electrode region and the fourth electrode region of each of the plurality of light-emitting diodes are respectively electrically connected to the first electrode region and the second electrode region of a corresponding one of the plurality of wells, thereby forming an emissive display.

2. The method for fabricating the emissive display according to claim 1, wherein a process of fabricating the package substrate further comprises:
   sequentially forming a first patterned electrode layer and a first photocuring polymer layer on a transparent substrate, and the transparent substrate and the first patterned electrode layer are covered with the first photocuring polymer layer;
   providing a first mother mold with a bottom thereof having a first imprinting pattern, using the first imprinting pattern of the first mother mold to imprint the first photocuring polymer layer such that the first mother mold touches the first patterned electrode layer, and using the first photocuring polymer layer to form a plurality of second imprinting patterns corresponding to the first imprinting pattern;
   using a first light to illuminate the first photocuring polymer layer to cure the first photocuring polymer layer;
   removing the first mother mold to expose the first patterned electrode layer and the plurality of second imprinting patterns;
   forming a second patterned electrode layer on the plurality of second imprinting patterns and arranging the second patterned electrode layer along an edge of each of the plurality of second imprinting patterns;
   forming a second photocuring polymer layer on the first patterned electrode layer, the second patterned electrode layer, and the plurality of second imprinting patterns to cover the first patterned electrode layer, the second patterned electrode layer, and the plurality of second imprinting patterns;
   providing a second mother mold with a bottom thereof having a third imprinting pattern, using the third imprinting pattern of the second mother mold to imprint the second photocuring polymer layer and the second patterned electrode layer such that the second mother mold touches the first patterned electrode layer and the second patterned electrode layer, using the second photocuring polymer layer to form a plurality of fourth imprinting patterns corresponding to the third imprinting pattern, and using the plurality of second imprinting patterns and the plurality of fourth imprinting patterns to separate the first patterned electrode layer from the second patterned electrode layer;
   using a second light to illuminate the second photocuring polymer layer to cure the second photocuring polymer layer; and
   removing the second mother mold to expose the plurality of fourth imprinting patterns, the first patterned electrode layer, and the second patterned electrode layer, using the plurality of fourth imprinting patterns, the first patterned electrode layer, and the second patterned electrode layer to form the plurality of wells, using the first pattered electrode layer as the first electrode region of each of the plurality of wells, and using the second pattered electrode layer as the second electrode region of each of the plurality of wells.

3. The method for fabricating the emissive display according to claim 2, wherein the first light and the second light are ultraviolet light.

4. The method for fabricating the emissive display according to claim 2, wherein the second pattered electrode layer consists of a plurality of ring-shaped electrodes, the plurality of ring-shaped electrodes are arranged on the plurality of second imprinting patterns, and each of the plurality of ring-shaped electrodes is arranged along an edge of a corresponding one of the plurality of second imprinting patterns.

5. The method for fabricating the emissive display according to claim 4, wherein a side wall of each of the plurality of fourth imprinting patterns and a corresponding one of the plurality of ring-shaped electrodes are form a conical surface.

6. The method for fabricating the emissive display according to claim 1, wherein the fourth electrode region is a ring-shaped electrode region.

7. The method for fabricating the emissive display according to claim 1, wherein the curved surface is a spherical surface.

8. The method for fabricating the emissive display according to claim 7, wherein the third electrode region is arranged at a center of the spherical surface.

9. The method for fabricating the emissive display according to claim 1, wherein a ratio of a weight of the plurality of light-emitting diodes to a weight of the suspension is larger than 0 and the ratio is less than or equal to 20%.

10. The method for fabricating the emissive display according to claim 1, wherein the sidewall and the bottom surface of each of the plurality of light-emitting diodes respectively have shapes of a sidewall and a bottom surface of a bowl.

* * * * *